United States Patent
Lu (10) Patent No.: US 11,482,297 B2
(45) Date of Patent: Oct. 25, 2022

(54) TEST METHOD FOR SELF-REFRESH FREQUENCY OF MEMORY ARRAY AND MEMORY ARRAY TEST DEVICE

(71) Applicant: CHANGXIN MEMORY TECHNOLOGIES, INC., Hefei (CN)

(72) Inventor: Tianchen Lu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/438,431

(22) PCT Filed: Jun. 8, 2021

(86) PCT No.: PCT/CN2021/098955
§ 371 (c)(1),
(2) Date: Sep. 12, 2021

(87) PCT Pub. No.: WO2022/041920
PCT Pub. Date: Mar. 3, 2022

(65) Prior Publication Data
US 2022/0270704 A1 Aug. 25, 2022

(30) Foreign Application Priority Data
Aug. 31, 2020 (CN) .......................... 202010892574.X (51) Int. Cl.
*G11C 29/46* (2006.01)
*G11C 11/406* (2006.01)
(Continued)

(52) U.S. Cl.
CPC ........ *G11C 29/46* (2013.01); *G11C 11/40615* (2013.01); *G11C 29/12015* (2013.01); *G11C 29/36* (2013.01)

(58) Field of Classification Search
CPC ..................................................... G11C 29/46
(Continued)

(56) References Cited

U.S. PATENT DOCUMENTS 5,299,168 A * 3/1994 Kang ..................... G11C 29/02
365/233.5
5,566,117 A 10/1996 Okamura et al.
(Continued)

FOREIGN PATENT DOCUMENTS

CN 102479543 B 6/2016
CN 107146637 A 9/2017
(Continued)

OTHER PUBLICATIONS

International Search Report and English Translation cited in PCT/CN2021/098955 dated Sep. 15, 2021, 9 pages.
(Continued)

*Primary Examiner* — Muna A Techane
(74) *Attorney, Agent, or Firm* — Cooper Legal Group, LLC (57) ABSTRACT

Disclosed are a test method for self-refresh frequency of a memory array and a memory array test device. The test method includes: providing a memory array; determining a shortest duration for charge in memory cells of the memory array to leak off, and marking the shortest duration as a first duration; setting an auto-refresh cycle of the memory array according to the first duration, where the auto-refresh cycle is longer than the first duration; performing m tests, where an $n^{th}$ test includes sequentially performing the following: refresh position count resetting, writing preset data to the memory array, performing a self-refresh having a duration of $T_n$, performing an auto-refresh having a duration of one auto-refresh cycle, reading the memory array, and recording a read status, where $T_{n-1}<T_n$, and $2 \leq n \leq m$.

10 Claims, 5 Drawing Sheets

(51) Int. Cl.
*G11C 29/12* (2006.01)
*G11C 29/36* (2006.01)

(58) Field of Classification Search
USPC .......................................................... 365/201
See application file for complete search history.

(56) References Cited

U.S. PATENT DOCUMENTS

| | | | | |
|---|---|---|---|---|
| 6,246,619 | B1* | 6/2001 | Ematrudo | G11C 29/50 |
| | | | | 365/201 |
| 8,254,197 | B2* | 8/2012 | Tashiiro | G11C 29/48 |
| | | | | 365/201 |
| 8,547,768 | B2 | 10/2013 | Shim et al. | |
| 10,037,787 | B2 | 7/2018 | Shiah et al. | |
| 2007/0014174 | A1 | 1/2007 | Ohsawa | |
| 2014/0095946 | A1* | 4/2014 | Mozak | G11C 29/56 |
| | | | | 714/718 |

FOREIGN PATENT DOCUMENTS

| | | |
|---|---|---|
| CN | 107799143 A | 3/2018 |
| JP | 2010135032 A | 6/2010 |

OTHER PUBLICATIONS

Written Opinion and English Translation cited in PCT/CN2021/098955 dated Sep. 15, 2021, 6 pages.

* cited by examiner

| CELL | CELL | CELL | CELL |
|------|------|------|------|
| CELL | CELL | CELL | CELL |
| CELL | CELL | CELL | CELL |
| CELL | CELL | CELL | CELL |
| CELL | CELL | CELL | CELL |
| CELL | CELL | CELL | CELL |
| CELL | CELL | CELL | CELL |
| CELL | CELL | CELL | CELL |
| CELL | CELL | CELL | CELL |
| CELL | CELL | CELL | CELL |

TEST METHOD FOR SELF-REFRESH FREQUENCY OF MEMORY ARRAY AND MEMORY ARRAY TEST DEVICE

CROSS-REFERENCE TO RELATED APPLICATIONS

The present disclosure claims priority to Chinese Patent Application No. 202010892574.X, titled "TEST METHOD FOR SELF-REFRESH FREQUENCY OF MEMORY ARRAY AND MEMORY ARRAY TEST DEVICE", filed on Aug. 31, 2020, which is incorporated herein by reference in its entirety.

TECHNICAL FIELD

The present disclosure relates to the technical field of integrated circuit fabrication, and exemplarily, relates to a test method for self-refresh frequency of a memory array and a memory array test device to which the test method is applied.

BACKGROUND

A dynamic random access memory (DRAM) is a type of semiconductor memory, which works mainly by using the presence or absence of charge stored in a storage capacitor to represent a binary bit of 1 or 0. Due to a leakage current in a transistor of a memory cell in reality, a quantity of charges stored in a storage capacitor connected to the transistor will change with the leakage current, causing loss of data. Therefore, for the DRAM, charging periodically, namely refreshing, is an inevitable requirement. Without refreshing, data stored in the DRAM will be lost within seconds at room temperature. Therefore, auto-refresh and self-refresh are usually set for a DRAM chip to ensure data integrity.

Auto-refresh is that a processor provides a refresh command to control the DRAM chip to perform one refresh operation, with refresh frequency controlled by the processor. The Joint Electron Device Engineering Council (JEDEC) defines that a DRAM chip must complete 8,192 auto-refreshes within 64 ms to refresh the entire chip, and an interval tREFI between two refreshes is defined as 7.8 μs. However, JEDEC only defines the DRAM self-refresh mode, without explicitly defining self-refresh frequency.

In the DRAM design, self-refresh frequency is often related to temperature and a data retention capability of a chip. Therefore, it is an important part in design verification to test the self-refresh frequency.

It should be noted that information disclosed in the above background section is used merely for a better understanding of the background of the present disclosure, and therefore may include information that does not constitute the prior art known to persons of ordinary skill in the art.

SUMMARY

According to a first aspect of the embodiments of the present disclosure, a test method for self-refresh frequency of a memory array is provided, including: providing a memory array; determining a shortest duration for charge in memory cells of the memory array to leak off, and marking the shortest duration as a first duration; setting an auto-refresh cycle of the memory array according to the first duration, where the auto-refresh cycle is longer than the first duration; performing m tests, where an $n^{th}$ test includes sequentially performing the following: refresh position count resetting, writing preset data to the memory array, performing a self-refresh having a duration of $T_n$, performing an auto-refresh having a duration of one auto-refresh cycle, reading the memory array, and recording a read status, where $T_{n-1} < T_n$, and $2 \leq n \leq m$; and determining self-refresh frequency of the memory array according to m read statuses corresponding to the m tests.

According to a second aspect of the present disclosure, a memory array test device is provided, including: a memory; and a processor, configured to execute code stored in the memory, to perform the test method for self-refresh frequency of a memory array according to any one of the items described above.

In the embodiments of the present disclosure, auto-refresh frequency that necessarily causes some memory cells to fail is used together with the self-refresh of the memory array, to perform a plurality of refresh tests; a range of memory cells that has been self-refreshed within a specified time Tn corresponding to each test may be determined according to a read status of each test; and a self-refresh cycle of the memory array is determined according to read statuses corresponding to the plurality of tests, so that self-refresh frequency of the memory array can be accurately calculated.

It should be understood that the above general description and the following detailed description are only exemplary and explanatory, and should not be construed as a limitation to the present disclosure.

BRIEF DESCRIPTION OF THE DRAWINGS

The accompanying drawings, which are incorporated into and constitute a part of the description, illustrate the embodiments of the present disclosure and together with the description, serve to explain the principles of the present disclosure. Apparently, the accompanying drawings in the following description show merely some embodiments of the present disclosure, and persons of ordinary skill in the art may still derive other drawings from these accompanying drawings without creative efforts.

FIG. 5A to FIG. 5C are schematic diagrams of a relationship between self-refresh coverage and a read status according to an embodiment of the present disclosure.

DETAILED DESCRIPTION

Exemplary embodiments will be described below in further detail with reference to the accompanying drawings. However, the exemplary embodiments can be implemented in a plurality of forms and should not be construed as being limited to examples described herein. On the contrary, these embodiments are provided such that the present disclosure is more comprehensive and complete, and fully conveys the concept of the exemplary embodiments to persons skilled in the art. The described features, structures, or characteristics may be incorporated into one or more embodiments in any suitable manner. In the following description, many specific details are provided to give a full understanding of the embodiments of the present disclosure. However, persons skilled in the art will be aware that the technical solutions of the present disclosure may be practiced with one or more of the specific details omitted, or other methods, components, apparatuses, steps, etc. may be used. In other cases, the publicly known technical solutions are not illustrated or described in detail, so as to avoid overshadowing and obscuring various aspects of the present disclosure.

In addition, the accompanying drawings are merely schematic diagrams of the present disclosure, and identical reference numerals in the accompanying drawings denote identical or similar parts. Therefore, repeated description thereof will be omitted. Some of the block diagrams shown in the accompanying drawings are functional entities, and do not necessarily correspond to physically or logically independent entities. These functional entities may be implemented in the form of software, or implemented in one or more hardware modules or integrated circuits, or implemented in different networks and/or processor apparatuses and/or microcontroller apparatuses.

The following describes in detail the exemplary embodiments of the present disclosure with reference to the accompanying drawings.

Figure 1:
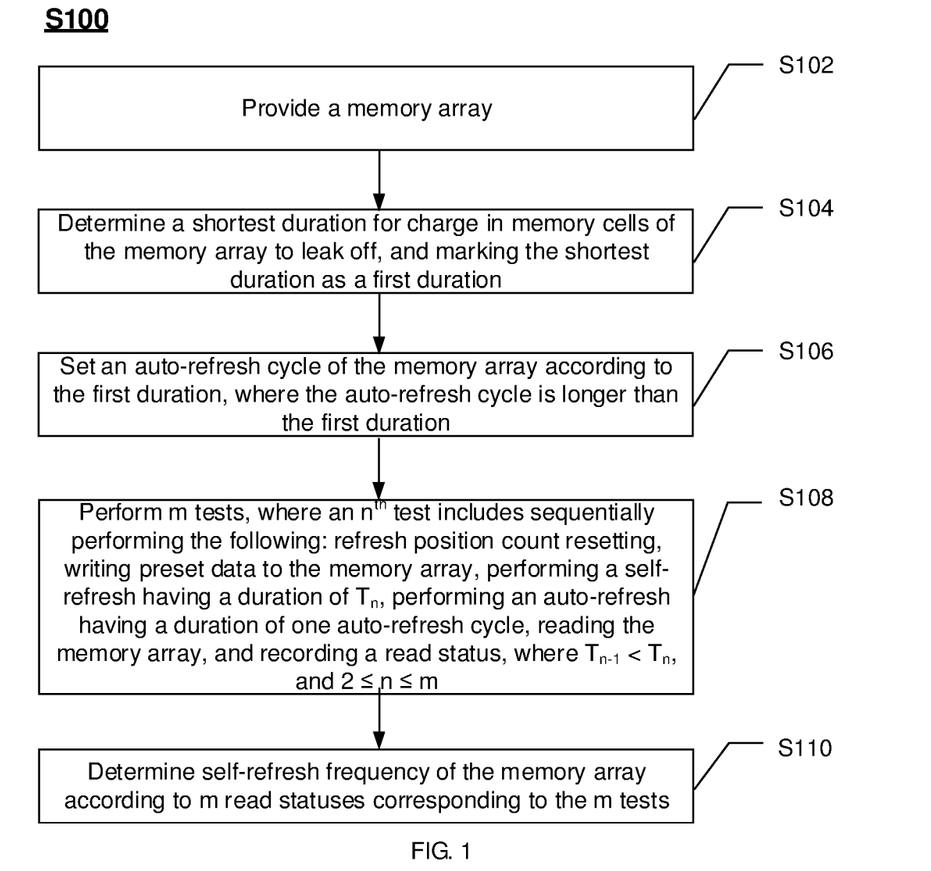
FIG. 1 is a flowchart of a test method for self-refresh frequency of a memory array according to an exemplary embodiment of the present disclosure.

FIG. 1 schematically illustrates a flowchart of a test method for self-refresh frequency of a memory array according to an exemplary embodiment of the present disclosure. Referring to FIG. 1, the test method 100 for self-refresh frequency of a memory array may include:

step S102: providing a memory array;

step S104: determining a shortest duration for charge in memory cells of the memory array to leak off, and marking the shortest duration as a first duration;

step S106: setting an auto-refresh cycle of the memory array according to the first duration, where the auto-refresh cycle is longer than the first duration;

step S108: performing m tests, where an $n^{th}$ test includes sequentially performing the following: refresh position count resetting, writing preset data to the memory array, performing a self-refresh having a duration of $T_n$, performing an auto-refresh having a duration of one auto-refresh cycle, reading the memory array, and recording a read status, where $T_{n-1} < T_n$, and $2 \leq n \leq m$; and step S110: determining self-refresh frequency of the memory array according to m read statuses corresponding to the m tests.

In the embodiments of the present disclosure, auto-refresh frequency that necessarily causes some memory cells to fail is used together with the self-refresh of the memory array, to perform a plurality of refresh tests; a range of memory cells that has been self-refreshed within a specified time $T_n$ corresponding to each test may be determined according to a read status of each test; and a self-refresh cycle of the memory array is determined according to read statuses corresponding to the plurality of tests, so that self-refresh frequency of the memory array can be accurately calculated.

The steps of the test method 100 for self-refresh frequency of a memory array are described below in detail.

At step S102, the memory array is provided.

Figure 2:
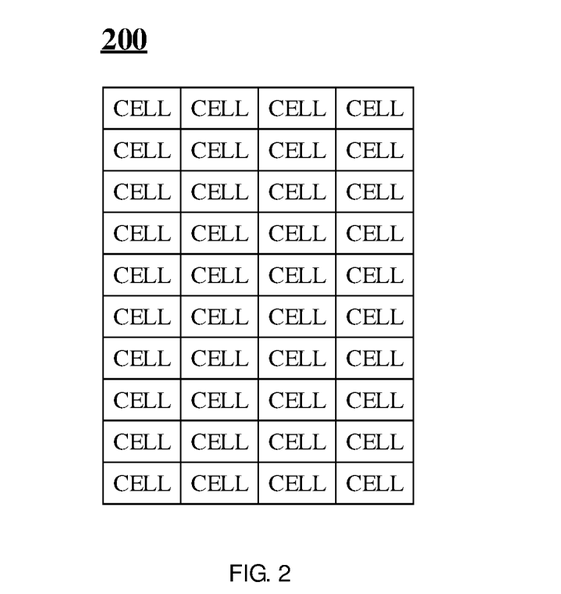
FIG. 2 is a schematic diagram of a memory array according to an embodiment of the present disclosure.

FIG. 2 is a schematic diagram of a memory array according to an embodiment of the present disclosure.

Referring to FIG. 2, in this embodiment of the present disclosure, the memory array 200 includes X rows and Y columns (X and Y are both positive integers) of memory cells, and each memory cell includes one transistor and one storage capacitor. One terminal of the storage capacitor is grounded, and the other terminal of the storage capacitor is connected to a first terminal of the transistor. A second terminal of the transistor is connected to a bit line (BL), and a control terminal of the transistor is connected to a word line (WL).

At step S104, the shortest duration for the charge in the memory cells of the memory array to leak off is determined, and the shortest duration is marked as the first duration.

In this embodiment of the present disclosure, an auto-refresh is mainly used together with a self-refresh, to perform a refresh test, and a range of memory cells that are self-refreshed in a corresponding time is determined by distinguishing between the action scopes of the auto-refresh and self-refresh. The self-refresh will certainly not cause an abnormal storage state of a memory cell. Therefore, it is necessary to set the auto-refresh to necessarily cause an abnormal storage state of a memory cell.

To determine auto-refresh frequency that necessarily causes charge leakage in at least one memory cell, the shortest duration for the charge in the memory cells of the memory array to leak off needs to be first determined in step S104, that is, a data retention capability of the memory array is calculated.

Figure 3:
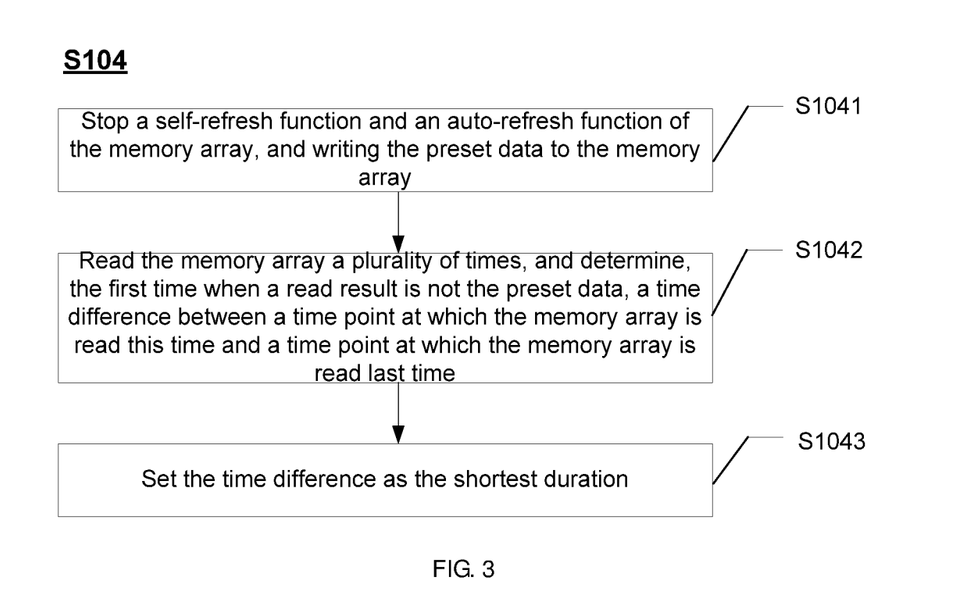
FIG. 3 is a sub-flowchart of step S104 in one embodiment of the present disclosure.

FIG. 3 is a sub-flowchart of step S104 in one embodiment of the present disclosure.

Referring to FIG. 3, step S104 may include:

step S1041: stopping a self-refresh function and an auto-refresh function of the memory array, and writing the preset data to the memory array;

step S1042: reading the memory array a plurality of times, and determining, the first time when a read result is not the preset data, a time difference between a time point at which the memory array is read this time and a time point at which the memory array is read last time; and step S1043: setting the time difference as the shortest duration.

The memory array 200 may be first controlled to stop a self-refresh and an auto-refresh, and then the preset data is written to all the memory cells of the memory array 200 by word lines and bit lines connecting the memory cells. For example, 1 is written to all the memory cells. Next, the data stored in all the memory cells is read the plurality of times, and the first time when it is found that the data stored is not the preset data (that is, a storage state of at least one memory cell has changed due to charge leakage), a time difference between a time point at which the data stored is read this time and a time point at which the data stored is read last time.

Since each time of reading is equivalent to one refresh, to accurately determine a failure duration of the memory cell, a time point (which may be a starting time point or an ending time point) at which the memory array is read the $k^{th}$ time is set to $t_k$ (k is a positive integer), $t_{k+1}-t_k$ and $t_k-t_{k-1}$ may have a fixed positive difference, and the difference is not greater than 0.01 seconds, for example, 0.01 seconds or 0.005 seconds. For example, if a difference between a time point of the third time of reading and a time point of the second time of reading is 1 s, and a read status is that the preset data has been read, the fourth time of reading may be performed after 1.01 s, to determine whether a leakage failure occurs after the memory array has not been refreshed for 1.01 s. If the read status is still that the preset data has been read, the fifth time of reading is performed 1.02 s later after the fourth time of reading, to determine whether a leakage failure occurs after the memory array has not been refreshed for 1.02 s. By analogy, until the read status is that the preset data has not been read, a time for which the memory array has not been refreshed before a leakage failure occurs is determined. In this way, the shortest duration for charge in the memory cells to leak off when the current memory array is not refreshed may be determined, and the shortest duration may be determined as the first duration. The first duration may represent a data retention capability of the memory array. It may be understood that a storage status of at least one memory cell has an exception (charge leakage) after the memory array has not been refreshed for the shortest duration since the last refresh. Therefore, in this embodiment of the present disclosure, the first memory cell that has a storage status exception is referred to as a worst memory cell of the memory array.

At step S106, the auto-refresh cycle of the memory array is set according to the first duration, where the auto-refresh cycle is longer than the first duration.

The auto-refresh cycle is a duration required for one auto-refresh of all the memory cells of the memory array.

In an embodiment, any preset value may be added to the first duration to determine the auto-refresh cycle of the memory array. Because the first duration is a time when a status of a memory cell in the memory array becomes abnormal, after the completion of the auto-refresh cycle, the status of the memory cell necessarily becomes abnormal.

In other embodiments, to more accurately determine the action scopes of the auto-refresh and the self-refresh, the auto-refresh cycle may be set to a sum of the first duration and the second duration, and the second duration is a ratio of the first duration to the number of refreshes in one refresh cycle corresponding to the memory array. For example, when the memory array is refreshed 8,192 times in one refresh cycle, a ratio of the first duration T1 to 8,192 is T2=T1/8,192. The second duration T2 is equal to a duration of one auto-refresh when the auto-refresh cycle is the first duration T1. The first duration and the second duration is added, so that a value of the auto-refresh cycle Tz can be set to be greater than a duration of 8,192 refreshes with the first duration T1 as a cycle, and not greater than a duration of 8193 refreshes with the first duration T1 as a cycle.

It should be noted that a plurality of rows of memory cells in the memory array may be refreshed during one refresh. Therefore, refreshing 8,192 times does not mean that the memory array has only 8,192 rows of memory cells.

At step S108, m tests are performed, where an $n^{th}$ test includes sequentially performing the following: refresh position count resetting, writing preset data to the memory array, performing a self-refresh having a duration of $T_n$, performing an auto-refresh having a duration of one auto-refresh cycle, reading the memory array, and recording a read status, where $T_{n-1} < T_n$, and $2 \leq n \leq m$.

Figure 4:
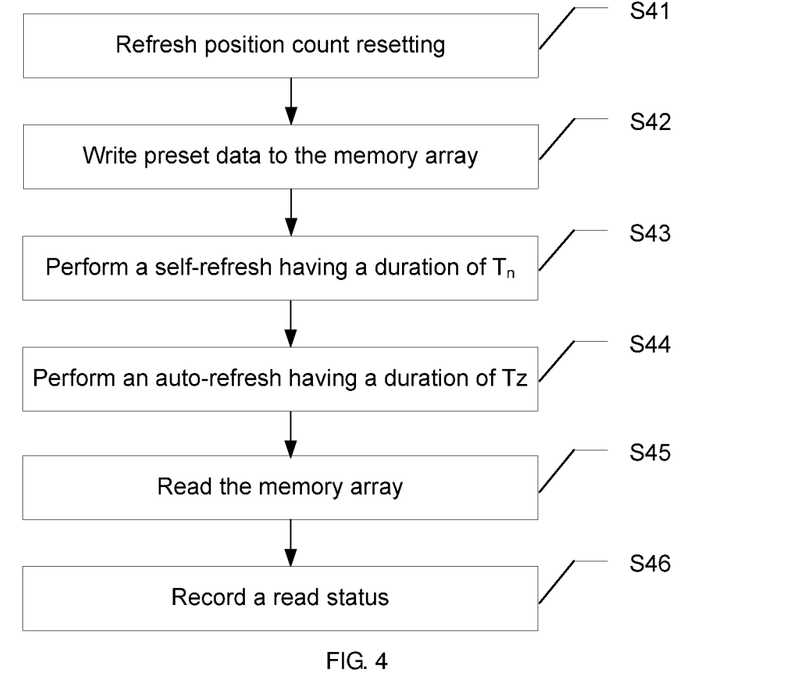
FIG. 4 is a schematic flowchart of one test according to an embodiment of the present disclosure.

FIG. 4 is a schematic flowchart of one test according to an embodiment of the present disclosure.

Referring to FIG. 4, procedures of one test mainly include:

step S41: refresh position count resetting;

step S42: writing preset data to the memory array;

step S43: performing a self-refresh having a duration of $T_n$;

step S44: performing an auto-refresh having a duration of Tz, where Tz is an auto-refresh cycle determined in step S106;

step S45: reading the memory array; and step S46: recording a read status.

An auto-refresh mode and a self-refresh mode share a refresh position counter. The refresh position counter is configured to record a refresh cut-off position (namely, a refresh position count), for example, an $i^{th}$ row in the memory array, where $1 \leq i \leq X$, and X is the number of rows of memory cells in the memory array.

Regardless of an auto-refresh or a self-refresh, the fresh starts from a $1^{st}$ row to an $X^{th}$ row, and after the entire memory array is refreshed, another circular refresh starts from the $1^{st}$ row. Therefore, a value of the counter increments from 1 to X, and then becomes 1 and increments from 1 again. Such a cycle is repeated until the auto-refresh or the self-refresh stops.

In this embodiment of the present disclosure, the counter is reset at the beginning of each test. After the self-refresh ends, a sequence number of the last row that is self-refreshed is set to i, and counter=i. Next, the auto-refresh is performed from an $(i+1)^{th}$ row until the end of one auto-refresh cycle, and counter=i. Because a reading of the counter is determined by an end position of the self-refresh, a self-refresh duration $T_n$ in each test is also definite. Therefore, a range covered by the self-refresh in the duration $T_n$ may be preliminarily determined according to the self-refresh duration $T_n$, the self-refresh cycle, and the reading i of the counter in each test.

If the self-refresh cycle is set to Ts, then:

$$T_n = (N_n + i_n/X) * Ts \quad (1)$$

where $N_n$ is the number of cycles of self-refresh performed in the $n^{th}$ test, and is an unknown positive integer; $i_n/X$ is a converted value of cycles of self-refresh performed, and $i_n/X$ is less than or equal to 1. The meaning of Formula (1) is as follows:

$T_n$ is equal to a duration of performing $(N_n + i_n/X)$ self-refresh cycles Ts.

To measure a value of the self-refresh cycles Ts, the auto-refresh is introduced in the present disclosure to generate a failed memory cell, so that a range covered by the self-refresh within the specified duration is further accurately determined according to the occurrence of the failed memory cell (that is, the abnormal storage status of at least one memory cell in the memory array causes the read status to be failed).

Figure 5A:
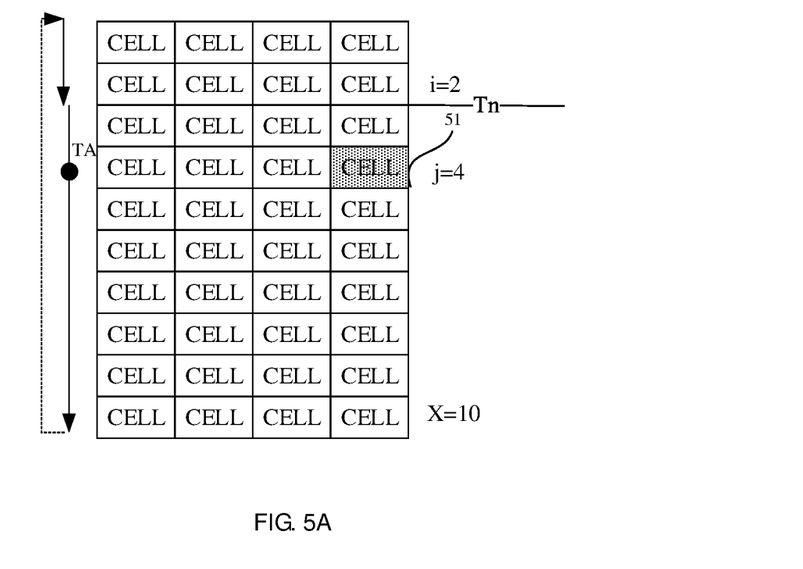
Figure 5B:
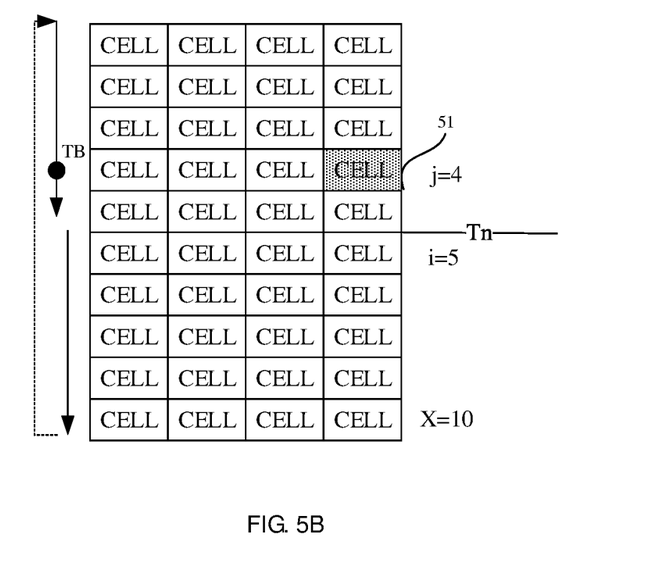
Figure 5C:
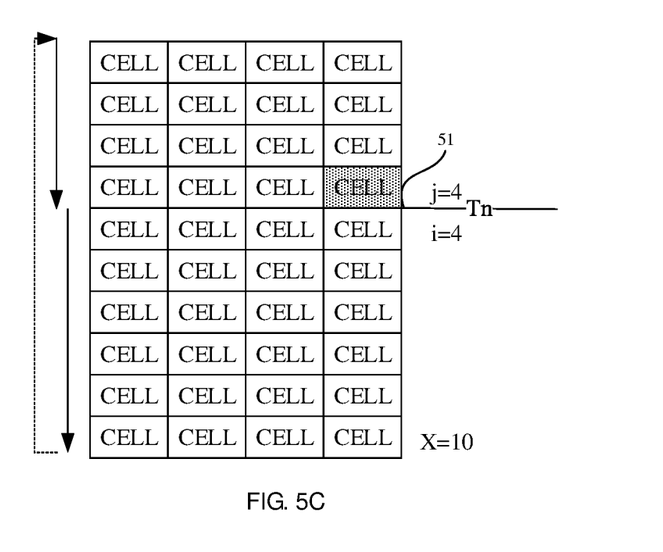

FIG. 5A to FIG. 5C are schematic diagrams of a relationship between self-refresh coverage and a read status according to an embodiment of the present disclosure.

It is assumed that a memory array 200 includes X rows of memory cells, and a worst memory cell 51 with the fastest charge leakage in the memory array 200 is located in a $j^{th}$ row. When a time interval between two refreshes of the memory cell 51 is greater than or equal to Tz, charge leakage and an abnormal storage status necessarily occur. When the time interval from the last refresh is equal to or exceeds Tz, charge leakage necessarily occurs.

In the $n^{th}$ test, after a self-refresh having a duration of $T_n$ is performed, counter=i. Because the self-refresh is performed at high frequency and high speed, all memory cells are considered to be in a fully charged state at the moment $T_n$.

Referring to FIG. 5A, when $i < j < X$, assuming that a time point at which the worst memory cell 51 is auto-refreshed is TA, a time difference $\Delta T_{refresh1}$ between two refreshes of the worst memory cell 51 is:

$$\Delta T_{refresh1} = TA - T_n = ((j-i)/X) * Tz \quad (2)$$

It can be seen that $\Delta T_{refresh1}$ is definitely less than Tz. If the auto-refresh cycle Tz is set properly to ensure that the worst memory cell 51 necessarily does not leak off charge when a non-charging duration is less than Tz, the worst memory cell 51 does not leak off charge in this case, which also means that the memory cells of the entire memory array do not leak off charge.

Because a time point at which the memory array is read is $T_n+Tz$, when the memory array is read, $T_n+Tz$ is substituted into Formula (2) to obtain the non-charging duration $\Delta T_{retention1}$ of the worst memory cell 51:

$$\Delta T_{retention1}=(T_n+Tz)-TA=((X+i-j)/X)*Tz \quad (3)$$

It can be seen from Formula (3) that $\Delta T_{retention1}<Tz$. If the auto-refresh cycle Tz is set properly to ensure that the worst memory cell 51 does not leak off charge when a non-charging duration is less than Tz, the memory cell 51 in a state shown in FIG. 5A does not leak off charge, that is, the memory cells of the entire memory array do not leak off current.

In this way, when $i \leq j < X$, all read statuses are that the preset data has been read, that is, the reading is successful.

Referring to FIG. 5B, when $0 < j < i$, assuming that a time point at which the worst memory cell 51 is auto-refreshed is TB, a time difference $\Delta T_{refresh2}$ between two refreshes of the worst memory cell 51 is:

$$\Delta T_{refresh2}=TB-T_n=((X-i+j)/X)*Tz \quad (4)$$

It can be seen that TB is definitely less than Tz. If the auto-refresh cycle Tz is set properly to ensure that the worst memory cell 51 does not leak off charge when a non-charging duration is less than Tz, the worst memory cell 51 does not leak off charge in this case, that is, the memory cells of the entire memory array do not leak off charge.

Because a time point at which the memory array is read is $T_n+Tz$, when the memory array is read, $T_n+Tz$ is substituted into Formula (4) to obtain the non-charging duration $\Delta T_{retention2}$ of the worst memory cell 51:

$$\Delta T_{retention2}=(T_n+Tz)-TB=((i-j)/X)*Tz \quad (5)$$

It can be seen from Formula (5) that $\Delta T_{retention2}<Tz$. If the auto-refresh cycle Tz is set properly to ensure that the worst memory cell 51 does not leak off charge when a non-charging duration is less than Tz, the memory cell 51 in a state shown in FIG. 5B does not leak off charge, that is, the memory cells of the entire memory array do not leak off current.

In this way, when $0 < j < i$, all read statuses are that the preset data has been read, that is, the reading is successful.

Referring to FIG. 5C, when $i=j$, a time interval between two refreshes of the worst memory cell 51 in a $j^{th}$ row is Tz, and charge leakage necessarily occurs. In this case, a read status is that the preset data has not been read, that is, the reading fails.

It may be learned from the above analysis that a value of i changes with $T_n$. Because a position of the worst memory cell 51 remains unchanged, that is, j remains unchanged, a value of $T_n$ may be changed to test read statuses corresponding to different values of $T_n$, so as to determine a corresponding test when counter=j.

At step S110, self-refresh frequency of the memory array is determined according to m read statuses corresponding to the m tests.

Figure 6:
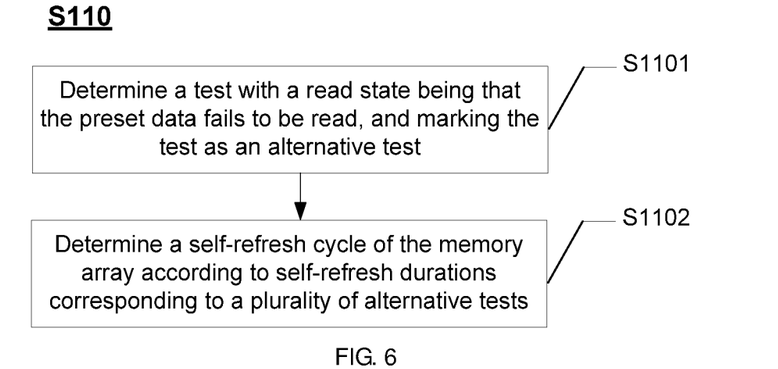
FIG. 6 is a sub-flowchart of step S110 in one embodiment of the present disclosure.

FIG. 6 is a sub-flowchart of step S110 in one embodiment of the present disclosure.

Referring to FIG. 6, step S110 may include:

step S1101: determining a test with a read state being that the preset data fails to be read, and marking the test as an alternative test; and step S1102: determining a self-refresh cycle of the memory array according to self-refresh durations corresponding to a plurality of alternative tests.

If it is known that read statuses corresponding to the $x^{th}$, $y^{th}$, and $z^{th}$ tests are all that the reading fails, it can be learned that the value of the counter corresponding to the $x^{th}$, $y^{th}$, and $z^{th}$ tests are all j. In this case, the $x^{th}$, $y^{th}$, and $z^{th}$ tests are all marked as alternative tests. According Formula (1), it may be learned that:

$$T_x=(N_x+i_x/X)*Ts \quad (6)$$

$$T_y=(N_y+i_y/X)*Ts \quad (7)$$

$$T_z=(N_z+i_z/X)*Ts \quad (8)$$

and:

$$i_x=i_y=i_z=j \quad (9)$$

then:

$$T_y-T_x=(N_y-N_x)*Ts \quad (10)$$

$$T_z-T_y=(N_z-N_y)*Ts \quad (11)$$

where $N_x$, $N_y$, and $N_z$ are all unknown integers. Because $T_x$, $T_y$, and $T_z$ are all known, Formulas (6) to (11) can be solved to obtain a value of Ts according to the values of $T_x$, $T_y$, and $T_z$.

Figure 7:
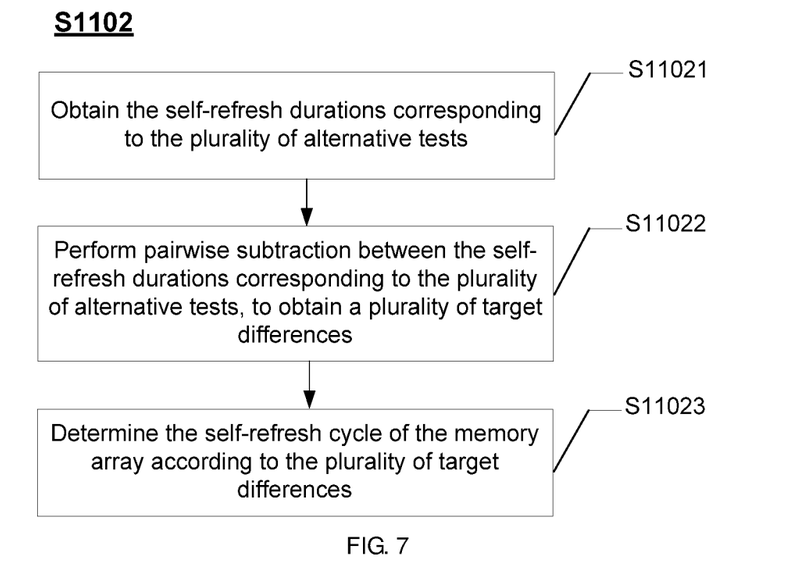
FIG. 7 is a sub-flowchart of step S1102 in one embodiment of the present disclosure.

FIG. 7 is a sub-flowchart of step S1102 in one embodiment of the present disclosure.

Referring to FIG. 7, step S1102 may include:

step S11021: obtaining the self-refresh durations corresponding to the plurality of alternative tests;

step S11022: performing pairwise subtraction between the self-refresh durations corresponding to the plurality of alternative tests, to obtain a plurality of target differences; and step S11023: determining the self-refresh cycle of the memory array according to the plurality of target differences.

The self-refresh durations corresponding to the plurality of alternative test are $T_x$, $T_y$, and $T_z$ in Formulas (6) to (9), and the target differences are $T_y-T_x$ and $T_z-T_y$ as shown in Formulas (10) and (11).

It can be seen from Formulas (10) and (11) that each target difference is an integral multiple of the self-refresh cycle of the memory array, and the multiple is unknown. Generally, a self-refresh cycle Ts is about 64 ms. Therefore, a specific value of Ts may be determined according to a quotient of $T_y-T_x$ divided by 64 ms and a quotient of $T_z-T_y$ divided by 64 ms. For example, if $(T_y-T_x)/64$ ms is equal to P, and P includes an integral part and a decimal part, P may be rounded to obtain [P] or [P]+1, and the value of Ts may be obtained according to $(T_y-T_x)/[P]$ or $(T_y-T_x)/([P]+1)$. When $(T_y-T_x)/[P]$ is closer to 64 ms than $(T_y-T_x)/([P]+1)$, it is determined that $Ts=(T_y-T_x)/[P]$. Otherwise, it is determined that $Ts=(T_y-T_x)/([P]+1)$.

For verification, whether $(T_z-T_y)/Ts$ is equal to an integer may be calculated, to determine the correctness of the calculation. Alternatively, the value of Ts may be calculated by using $(T_z-T_y)/64$ ms=Q according to the above logic, so as to confirm the value of Ts.

In some cases, to facilitate calculation of the value of Ts, a difference between the self-refresh duration $T_n$ of the $n^{th}$ test and a self-refresh duration $T_{n-1}$ of the $(n-1)^{th}$ test may be set to a fixed value, for example, the fixed value may be less than 1 µs. In this case, between two most recent tests whose read statuses being that the reading fails in the self-refresh duration, an interval of the self-refresh duration is one self-refresh cycle, and the self-refresh cycle Ts may be determined only by subtracting the self-refresh durations corresponding to the two tests.

To accurately determine $T_z$ and ensure that power failure will not occur in the worst memory cell 51 when i=j+1 and i=j−1, in this embodiment of the present disclosure, the auto-refresh cycle $T_z$ may be set to a sum of the first duration and the second duration, and the second duration is a ratio of the first duration to the number of refreshes in one auto-refresh cycle corresponding to the memory array.

For example, when the memory array is refreshed 8,192 times in one refresh cycle (that is, X=8,192), and Tz=T1, a duration of one auto-refresh is T2=T1/8,192. The first duration T1 is added to the second duration T2, to ensure that power failure will not occur in the worst memory cell 51 in both cases of i=j+1 and i=j−1.

After the self-refresh cycle Ts is tested, self-refresh frequency may be determined according to a ratio of the number of refreshes in one refresh cycle to the self-refresh cycle, so as to accurately test the self-refresh frequency. In one embodiment, the number of refreshes in one refresh cycle of the memory array is 8,192.

Figure 8:
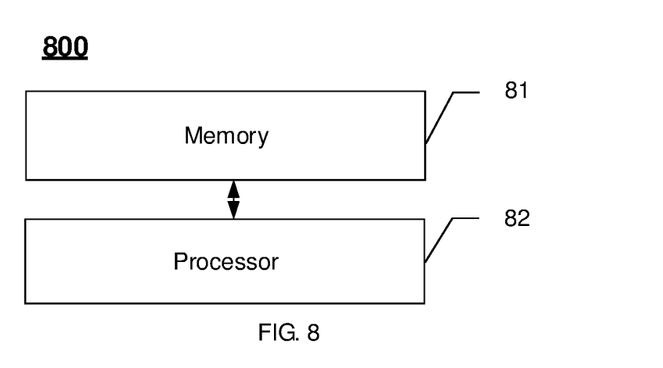
FIG. 8 is a schematic diagram of a memory array test device in one embodiment of the present disclosure.

FIG. 8 is a schematic diagram of a memory array test device in one embodiment of the present disclosure.

Referring to FIG. 8, the memory array test device 800 may include:

a memory 81; and a processor 82, configured to execute code stored in the memory, to perform the test method for self-refresh frequency of a memory array according to any one of the items described above.

Through the foregoing description of the embodiments, persons skilled in the art may easily understand that the exemplary embodiments described herein may be implemented by software, or may be implemented by software in combination with necessary hardware. Therefore, the technical solutions according to the embodiments of the present disclosure may be implemented in a form of a software product. The software product may be stored in a non-volatile storage medium (which may be a CD-ROM, a USB flash drive, a removable hard disk, or the like) or on the network, and includes a plurality of instructions to cause a computing device (which may be a personal computer, a server, a terminal apparatus, a network device, or the like) to perform the method according to the embodiments of the present disclosure.

In addition, the foregoing accompanying drawings are merely schematic illustrations of the processing included in the method according to the exemplary embodiments of the present invention, and are not intended for limitation. It is easily understood that the processes shown in the foregoing accompanying drawings does not indicate or limit a chronological sequence of these processes. In addition, it is also easily understood that these processes can be performed synchronously or asynchronously, for example, in a plurality of modules.

A person skilled in the art may easily think of other implementation solutions of the present disclosure after considering the specification and practicing the content disclosed herein. The present disclosure is intended to cover any variations, purposes or adaptive changes of the present disclosure. Such variations, purposes or applicable changes follow the general principle of the present disclosure and include common knowledge or conventional technical means in the technical field which is not disclosed in the present disclosure. The specification and embodiments are merely considered as illustrative, and the real scope and concept of the present disclosure are specified by the appended claims.

INDUSTRIAL APPLICABILITY

In the embodiments of the present disclosure, auto-refresh frequency that necessarily causes some memory cells to fail is used together with the self-refresh of the memory array, to perform a plurality of refresh tests; a range of memory cells that has been self-refreshed within a specified time Tn corresponding to each test may be determined according to a read status of each test; and a self-refresh cycle of the memory array is determined according to read statuses corresponding to the plurality of tests, so that self-refresh frequency of the memory array can be accurately calculated.

The invention claimed is:

1. A test method for self-refresh frequency of a memory array, comprising:

providing a memory array;

determining a shortest duration for charge in memory cells of the memory array to leak off, and marking the shortest duration as a first duration;

setting an auto-refresh cycle of the memory array according to the first duration, wherein the auto-refresh cycle is longer than the first duration;

performing m tests, wherein an $n^{th}$ test comprises sequentially performing the following: refresh position count resetting, writing preset data to the memory array, performing a self-refresh having a duration of $T_n$, performing an auto-refresh having a duration of one auto-refresh cycle, reading the memory array, and recording a read status, wherein $T_{n-1}<T_n$, and $2 \le n \le m$; and determining the self-refresh frequency of the memory array according to m read statuses corresponding to the m tests.

2. The test method for self-refresh frequency of a memory array according to claim 1, wherein the determining a shortest duration for charge in memory cells of the memory array to leak off comprises:

stopping a self-refresh function and an auto-refresh function of the memory array, and writing the preset data to the memory array;

reading the memory array a plurality of times, and determining, at the first time when a read result is not the preset data, a time difference between a time point at which the memory array is read this time and a time point at which the memory array is read last time; and setting the time difference as the shortest duration.

3. The test method for self-refresh frequency of a memory array according to claim 2, wherein the reading the memory array a plurality of times comprises: when a time point at which the memory array is read the $k^{th}$ time is $t_k$, a difference between $t_{k+1}-t_k$ and $t_k-t_{k-1}$ is not greater than 0.01 seconds, wherein k is a positive integer, and $k \ge 2$.

4. The test method for self-refresh frequency of a memory array according to claim 1, wherein the setting an auto-refresh cycle of the memory array according to the first duration comprises:
- determining a ratio of the first duration to a number of refreshes in one auto-refresh cycle corresponding to the memory array, and marking the ratio as a second duration; and
- setting the auto-refresh cycle to a sum of the first duration and the second duration.

5. The test method for self-refresh frequency of a memory array according to claim 1, wherein the determining the self-refresh frequency of the memory array according to m read statuses corresponding to the m tests comprises:
- determining a test with a read state being that the preset data fails to be read, and marking the test as an alternative test; and
- determining a self-refresh cycle of the memory array according to self-refresh durations corresponding to a plurality of alternative tests.

6. The test method for self-refresh frequency of a memory array according to claim 5, wherein the determining a self-refresh cycle of the memory array according to self-refresh durations corresponding to a plurality of alternative tests comprises:
- obtaining the self-refresh durations corresponding to the plurality of alternative tests;
- performing pairwise subtraction between the self-refresh durations corresponding to the plurality of alternative tests, to obtain a plurality of target differences; and
- determining the self-refresh cycle of the memory array according to the plurality of target differences.

7. The test method for self-refresh frequency of a memory array according to claim 1, wherein a difference between a self-refresh duration $T_n$ of a $n^{th}$ test and a self-refresh duration $T_{n-1}$ of a $(n-1)^{th}$ test is a fixed value, and the difference is less than 1 μs.

8. The test method for self-refresh frequency of a memory array according to claim 1, wherein the determining the self-refresh frequency of the memory array according to m read statuses corresponding to the m tests comprises:
- determining a self-refresh cycle of the memory array according to the m read statuses corresponding to the m tests;
- determining a number of refreshes in one refresh cycle of the memory array; and
- determining the self-refresh frequency of the memory array according to a ratio of the number of refreshes in one refresh cycle of the memory array to the self-refresh cycle of the memory array.

9. The test method for self-refresh frequency of a memory array according to claim 4, wherein the number of refreshes in one refresh cycle of the memory array is 8,192.

10. A memory array test device, comprising:
- a memory; and
- a processor, configured to execute code stored in the memory, to perform the test method for self-refresh frequency of a memory array according to claim 1.

* * * * *